United States Patent [19]

Evans et al.

[11] Patent Number: 4,531,103

[45] Date of Patent: Jul. 23, 1985

[54] MULTIDIAMETER CAVITY FOR REDUCED MODE COMPETITION IN GYROTRON OSCILLATOR

[75] Inventors: Steven J. Evans, Mountain View; Robert S. Symons, Los Altos, both of Calif.

[73] Assignee: Varian Associates, Inc., Palo Alto, Calif.

[21] Appl. No.: 448,663

[22] Filed: Dec. 10, 1982

[51] Int. Cl.³ ............................................ H03B 9/08

[52] U.S. Cl. ..................................... 331/83; 315/3.6; 315/5

[58] Field of Search ...................... 331/79, 81, 82, 83, 331/86, 91; 315/3.6, 5, 5.35, 5.39, 5.43, 5.49, 37, 39.65

[56] References Cited

U.S. PATENT DOCUMENTS 4,388,555 6/1983 Symons et al. .................... 315/5 X
4,398,121 8/1983 Chodorow et al. ................ 315/5 X

FOREIGN PATENT DOCUMENTS 0661664 5/1979 U.S.S.R. ............................ 333/228

*Primary Examiner*—Eugene R. LaRoche
*Assistant Examiner*—Robert J. Pascal
*Attorney, Agent, or Firm*—Stanley Z. Cole; Richard B. Nelson

[57] ABSTRACT

In a gyro-monotron oscillator a single, "monotron" cavity is used to interact with the electron beam. To handle very high powers without excessive cavity loss, the cavity is excited in a higher order mode such as $TE_{0m1}$. Other modes can be resonant in the cavity, interfering with the operation when their frequency is near the operating frequency.

To increase the mode separation, an upstream section of the cavity is made smaller, to support only a lower-order mode such as $TE_{011}$. Also, the beam is pre-bunched by this lower order, interference-free mode so has less tendency to interact with spurious modes in the higher order cavity.

8 Claims, 5 Drawing Figures

MULTIDIAMETER CAVITY FOR REDUCED MODE COMPETITION IN GYROTRON OSCILLATOR

FIELD OF THE INVENTION

The invention pertains to tubes for generating microwave power by interaction of an electron beam with electromagnetic fields of resonant cavities. The highest powers have been produced by tubes of the gyrotron type wherein cyclotron motions of the electrons in a strong steady axial magnetic field interact with microwave electric fields transverse to the axis. In the usual gyro-monotron oscillator, the electric fields are those of a standing wave in a mode with circular transverse electric field. To handle very high power at high frequencies, large cavities are used, operating in $TE_{0n}$ modes. These modes are sometimes of higher orders than the $TE_{01}$ to reduce cavity losses. The large cavities can also support many other modes which do not have circular electric field. When the frequency of an unwanted mode is close to the operating frequency, energy can be cross-coupled into it, degrading the tube's performance. Also, the unwanted mode can sometimes interact with the beam, causing oscillation with low efficiency.

PRIOR ART

The number of possible spurious modes resonant in a given frequency range increases with the size of the cavity. The basic technique for handling mode interference in the past has been to compromise between cavity size and mode frequency separation. In this way, however, neither one is optimized.

When operating in a circular-electric-field mode, there are methods based on the symmetry to discourage modes which do not have the circular fields. One method which has been used for a long time is to have grooves in the cavity (or waveguide) running around the circumference in the direction of rf current flow. Resistive material is placed in the bottom of the grooves or in an outside chamber behind them. Most of the unwanted modes will have wall currents crossing the grooves, so these modes are selectively damped. The idea is to reduce their resonant impedances so they don't interact strongly with the electron stream.

U.S. Pat. No. 3,471,744, issued Oct. 7, 1969 to G. G. Pryor, describes slot-type mode absorbers in a magnetron resonant cavity. U.S. Pat. No. 3,441,793, issued Apr. 29, 1969 to Poda Fosse and G. E. Glenfield, describes circular slots in a waveguide for coupling noncircular modes to an absorber outside the guide. U.S. Pat. No. 3,008,102, issued Nov. 11, 1961 to Maurice W. St. Clair, describes a circular-electric-field stabilizing cavity in which the cylindrical wall is made of circular conductors interspersed with lossy material. The above-cited patents are assigned to the assignee of the present application. They all involve absorbing, within the cavity, the energy of non-circular modes.

In extremely high-power and high-frequency tubes, the resistive-groove scheme runs into a limitation. The power dissipated in the resistive material generates more heat than can be carried away by conduction. To overcome this problem, an improved structure is described in U.S. Pat. No. 4,398,121, filed Feb. 5, 1981 by Marvin Chodorow and Robert S. Symons and assigned to the assignee of this application. In this scheme, a groove in the direction of the circular current is constructed in only low-loss material. Modes having wall currents crossing the groove, in particular some very troublesome TM modes, have their mode patterns distorted such that their energy is radiated out thru the output waveguide, thus reducing the impedance of those unwanted modes.

SUMMARY OF THE INVENTION

An object of the invention is to provide a microwave oscillator with reduced mode-interference problems.

Another object is to provide an oscillator with increased efficiency.

Still another object is to provide an oscillator with increased power output.

These objectives are realized by constructing the resonant cavity of the oscillator with two sections having different cross-sectional dimensions. The section near the beam-entrance port is relatively small in diameter and preferably supports a low-order mode such as $TE_{011}$. The section near the beam-exit port is larger, supporting a higher order mode such as $TE_{021}$. The modes are strongly coupled because the junction between sections is open, with no constricted aperture. The second section contains the highest fields, but being larger it can carry the high powers. A principal advantage of the invention is that the large section is shorter than in the prior art, so the frequency spacing between unwanted modes is increased and mode interference is reduced. A further advantage is that the high-order modes of the large output section can not penetrate into the small input section. Hence the beam is pre-bunched by the desired mode, which discourages interaction with unwanted modes.

DESCRIPTION OF THE PREFERRED EMBODIMENTS

Figure 1:
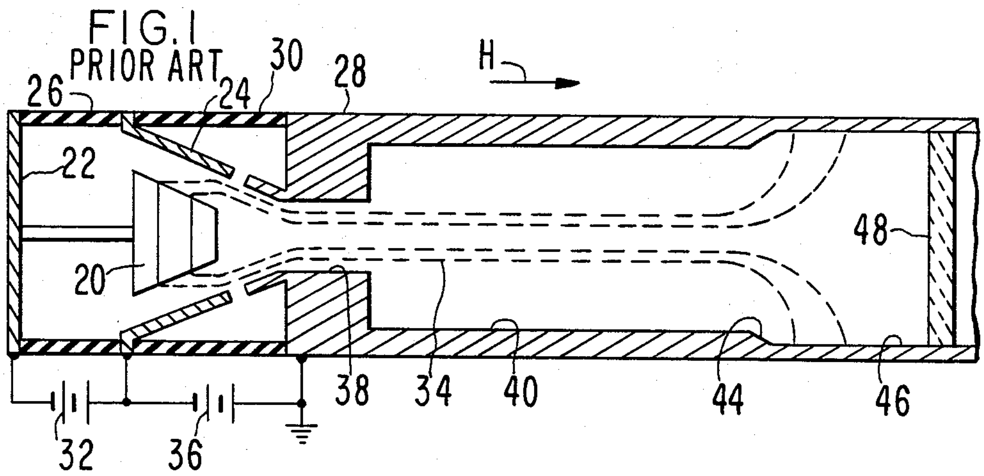
FIG. 1 PRIOR ART
FIG. 1 is a schematic axial section of a prior-art gyrotron oscillator.

FIG. 1 illustrates a single-cavity gyrotron oscillator of the prior-art. The gyrotron is a microwave tube in which a beam of electrons having a spiral motion in an axial magnetic field parallel to their drift direction interacts with the electric fields of a wave-supporting circuit. The electric field in practical tubes is in a circular-electric-field mode. In the gyro-klystron the wave-supporting circuit is a resonant cavity, usually resonating in a $TE_{0ml}$ mode. In FIG. 1 all parts are figures of revolution about the axis.

In the gyro-klystron of FIG. 1 a thermionic cathode 20 is supported on the end plate 22 of the vacuum envelope. End plate 22 is sealed to the accelerating anode 24 by a dielectric envelope member 26. Anode 24 in turn is sealed to the main tube body 28 by a second dielectric member 30. In operation, cathode 20 is held at a potential negative to anode 24 by a power supply 32. Cathode 20 is heated by a radiant internal heater (not shown). Thermionic electrons are drawn from its conical outer emitting surface by the attractive field of the coaxial conical anode 24. The entire structure is immersed in an axial magnetic field H produced by a surrounding solenoid magnet (not shown). The initial radial motion of the electrons is converted by the crossed electric and magnetic fields to a motion away from cathode 20 and spiralling about the axis, forming a hollow spiral beam 34. Anode 24 is held at a potential negative to tube body 28 by a second power supply 36, giving further axial acceleration to the beam 34. In the region between cathode 20 and body 28, the strength of magnetic field H is increased greatly, causing beam 34 to be compressed in diameter and also increasing its rotational energy at the expense of axial energy. The rotational energy is the part involved in the useful interaction with the circuit wave fields. The axial energy merely provides beam transport through the interacting region.

Beam 34 passes through a drift-tube 38 into the interaction cavity 40 which is resonant at the operating frequency in a $TE_{0ml}$ mode. In this example, it is $TE_{021}$. The magnetic field strength H is adjusted so that the cylotron-frequency rotary motion of the electrons is approximately synchronous with the cavity resonance. The interaction produces a phase bunching of beam 34, that is, the electrons' rotary motions are synchronized. They can then deliver rotational energy to the circular electric field, setting up a sustained oscillation.

At the output end of cavity 40 an outwardly tapered section 44 couples the output energy into a uniform waveguide 46 which has a greater diameter than resonant cavity 40 in order to propagate a traveling wave. Near the output of cavity 40 the magnetic field H is reduced. Beam 34 thus expands in diameter under the influence of the expanding magnetic field lines and its own self-repulsive space charge. Beam 34 is then collected on the inner wall of waveguide 46, which also serves as a beam collector. A dielectric window 48, as of alumina ceramic, is sealed across waveguide 46 to complete the vacuum envelope.

Figure 2A:
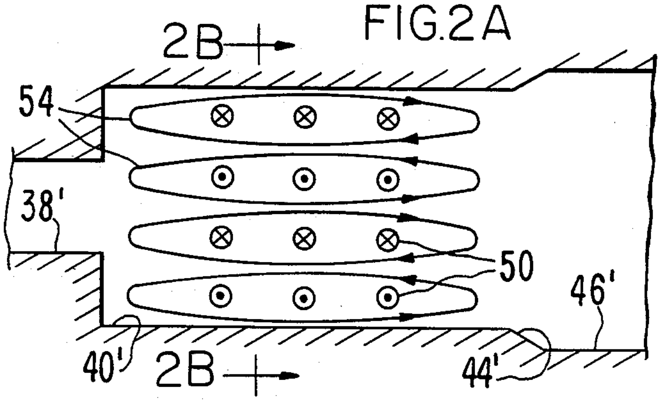
FIGS. 2 are schematic field-pattern diagrams of the cavity of FIG. 1.

FIG. 2A is a sketch of the standing-wave electromagnetic fields in cavity 40' of FIG. 1, as seen in an axial plane. The resonant mode is basically $TE_{021}$. There is no variation of field with rotation about the axis. There is a field reversal, with 2 maxima between the axis and the cylindrical cavity wall. There is a single maximum with axial distance thru the cavity; that is, as a transmission line it would be resonant in the $\frac{1}{2}$ wavelength mode.

Figure 2B:
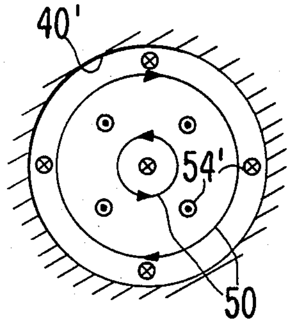

FIG. 2B is a sketch of the field-pattern as seen looking along the axis.

FIG. 2A is somewhat idealized. It shows the fields for a pure standing wave as if cavity 40 were closed at both ends. In practical gyrotrons of very high power, the fields build up rapidly with passage thru the circuit and the output end is strongly coupled to the output waveguide. There is no partially-reflecting iris as in low-power tubes. The cavity wall 40' simply enlarges via a taper 44' into a transmitting waveguide 46'. The fields in cavity 40 thus depart considerably from the pure standing-wave pattern shown. The latter, however, can be calculated and illustrated simply. A $TE_{021}$ mode is illustrated. The lines of electric field 50 are circles perpendicular to the axis of the cylindrical cavity. The lines of magnetic force 54 are closed loops lying in planes which include the axis.

Figure 3:
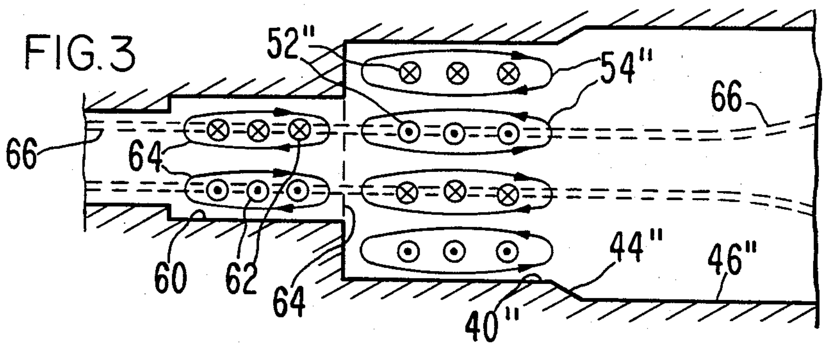
FIG. 3 is a schematic axial section of a gyrotron embodying the invention.

FIG. 3 shows a schematic axial section of a gyrotron cavity embodying the invention. The large cavity section 40'' carrying the $TE_{021}$ mode is shorter than in the prior-art tube of FIGS. 1 and 2. It is directly coupled to the smaller cavity section 60 which supports a $TE_{011}$ mode. At or near the junction plane 64 the electric field reverses from the $TE_{011}$ to the inner maximum of the $TE_{021}$. At approximately the radius of this maximum a hollow, cylindrical beam of electrons 66 traverses the cavity, entering at the small cavity 60.

Even though the two cavity sections are strongly coupled together, the fields in the small section 60 are lower than in the large section 40'' because both the rf current in beam 66 and the wave amplitudes are built-up rapidly with the distance of travel of beam 66. There is a large traveling-wave component of the wave. Thus, the circulating wall currents in the input section 60 are less than they would be in the output section if it were the same size as section 60 and carried the same $TE_{011}$ mode. In the output section 40'', the losses are reduced because the cavity is bigger and carries a higher order mode. Of course, the bigger section 40'' can support more unwanted modes, but the mode separation is greater than in the prior-art cavity of FIGS. 2 because the axial length of section 40'' is shorter. Most of the unwanted modes cannot be supported in the smaller section 60. Therefore the beam is initially bunched by the desired mode, which discourages competition by the unwanted modes in large output cavity 40''. The total gain for an unwanted mode oscillation is reduced because the interaction can occur only over a shorter length.

The fields in input section 60 can be further reduced, with a further reduction in cavity loss. Also, lower input field can increase the tube's efficiency by bunching the beam with lower field as in a traveling-wave tube. One way to do this is to have input section 60 dimensioned to be near cut-off at the operating frequency.

Figure 4:
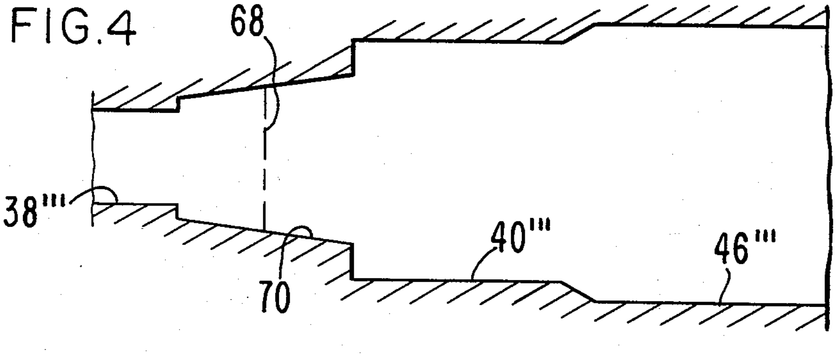
FIG. 4 is a schematic axial section of a different embodiment.

FIG. 4 illustrates an embodiment of the invention in which the build-up of field with distance in section 60 is made greater. Here the diameter of the input section 70 is tapered larger with distance from the input drift-tube 38'''. It may be exactly cut off at some intermediate point 68. Whether it is cut off or not, the fields will decrease with decreasing diameter. The cross-section of input section 70 need not taper smoothly as shown, but may have steps or changes in slope.

The fields in output section 40''' may also be caused to increase with distance from the beam entrance by tapering its cross-section larger with this distance, whereby the oscillator efficiency may be improved.

Other embodiments of the invention will be apparent to those skilled in the art. The above embodiments are to be regarded as exemplary and not limiting. The scope of the invention is to be limited only by the following claims and their legal equivalents.

We claim:

1. A gyrotron oscillator comprising a resonant cavity for supporting a standing electromagnetic wave in energy-exchanging relationship with an electron beam, the improvement being that said cavity comprises a plurality of sequential sections along the drift axis of said beam, a first upstream section having a smaller cross-section perpendicular to said axis than a second downstream section the change between cross sections being abrupt in the axial direction.

2. The oscillator of claim 1 wherein said second section is large enough to support an interaction wave in a higher order mode than the interaction wave supported in said first section.

3. The oscillator of claim 2 wherein said sections are directly connected, such that said interaction waves are directly coupled.

4. The oscillator of claim 3 wherein the dimensions of the coupling opening between said sections transverse to said axis are at least as large as the dimensions of said first section transverse to said axis.

5. The oscillator of claim 2 wherein said interaction waves are $TE_{0nn}$ waves.

6. The oscillator of claim 5 wherein said interaction wave in said first section is a $TE_{01n}$ mode.

7. The oscillator of claim 1 wherein said cross-section of said first upstream section increases with distance from the end where the beam enters it.

8. The oscillator of claim 1 wherein said cross-section of said second downstream section increases with distance from the end where the beam enters it.

* * * * *